(12) United States Patent
Paxton et al.

(10) Patent No.: US 7,639,722 B1
(45) Date of Patent: Dec. 29, 2009

(54) MULTIFACETED PRISM TO CAUSE THE OVERLAP OF BEAMS FROM A STACK OF DIODE LASER BARS

(75) Inventors: Alan H. Paxton, Albuquerque, NM (US); Harold C. Miller, Albuquerque, NM (US); Jonathan Stohs, Albuquerque, NM (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 25 days.

(21) Appl. No.: 11/926,246

(22) Filed: Oct. 29, 2007

(51) Int. Cl.
*H01S 3/092* (2006.01)
(52) U.S. Cl. .............................. 372/71; 372/75; 372/70; 359/834; 359/831
(58) Field of Classification Search ................... 372/71, 372/75, 70; 359/831, 834
See application file for complete search history.

(56) References Cited

U.S. PATENT DOCUMENTS

| | | | | | |
|---|---|---|---|---|---|
| 4,306,278 | A | * | 12/1981 | Fulton et al. | 362/259 |
| 5,081,637 | A | * | 1/1992 | Fan et al. | 372/72 |
| 5,268,920 | A | * | 12/1993 | Esterowitz et al. | 372/71 |
| 6,700,709 | B1 | * | 3/2004 | Fermann | 359/641 |

OTHER PUBLICATIONS

C. Stewan et al, "A 1-kW Thin Disc Laser", IEEE J. Selected Topics in Quaint. Electronics, 6 650, 2000.

* cited by examiner

*Primary Examiner*—Minsun Harvey
*Assistant Examiner*—Kinam Park
(74) *Attorney, Agent, or Firm*—Kenneth E. Callahan

(57) ABSTRACT

An optical element for homogenizing and, possibly, concentrating the output from high-power two-dimensional semiconductor laser arrays, which has the basic shape of a convex-flat cylindrical lens with a facet cut into the convex surface for each individual semiconductor laser bar.

1 Claim, 3 Drawing Sheets

| $y$ (mm) | $z-z_f$ (mm) | $\alpha$ (rad) | $\zeta$ (mm) | $\zeta$ (mm), fit |
|---|---|---|---|---|
| 0.90 | 0.00579 | 0.002572 | 150.4593 | 150.4593 |
| 2.70 | 0.05209 | 0.051456 | 150.3706 | 150.3706 |
| 4.50 | 0.14479 | 0.077226 | 150.2224 | 150.2224 |
| 6.30 | 0.28408 | 0.103048 | 150.0145 | 150.0144 |
| 8.10 | 0.47022 | 0.128939 | 149.7465 | 149.7462 |
| 9.90 | 0.70361 | 0.154918 | 149.4178 | 149.4170 |
| 11.70 | 0.98471 | 0.181002 | 149.0276 | 149.0260 |
| 13.50 | 1.31412 | 0.207212 | 148.5750 | 148.5722 |
| 15.30 | 1.69253 | 0.233567 | 148.0591 | 148.0544 |
| 17.10 | 2.12077 | 0.260088 | 147.4787 | 147.4712 |
| 18.90 | 2.59978 | 0.286798 | 146.8322 | 146.8209 |
| 20.70 | 3.13065 | 0.313720 | 146.1181 | 146.1016 |
| 22.50 | 3.71463 | | | |

FIG. 3

Coordinates of vertices calculated using Eqs. 1 and 4, facet angles, locations where the central rays cross the z-axis, and coordinates for the crossing points assuming third-order spherical aberration. The variable $z_f$ is the coordinate of the cylinder, corresponding to the surface of the blank, at y=0.

MULTIFACETED PRISM TO CAUSE THE OVERLAP OF BEAMS FROM A STACK OF DIODE LASER BARS

STATEMENT OF GOVERNMENT INTEREST

The conditions under which this invention was made are such as to entitle the Government of the United States under paragraph 1(a) of Executive Order 10096, as represented by the Secretary of the Air Force, to the entire right, title and interest therein, including foreign rights.

BACKGROUND OF THE INVENTION

The present invention relates to optical pumping of lasers, and in particular, to an optical element for homogenizing and concentrating the output of laser arrays used to pump solid-state lasers.

A high-average-power solid-state laser is typically pumped by injecting light from high-power two-dimensional semiconductor laser arrays. The arrays are also called stacks because they are stacks of bars. The laser arrays are frequently fitted with lenses that separately collimate the output of the bars so that the pump light is collimated well enough for transmission to the solid-state laser gain medium. The resulting output from a typical array consists of a beam of light from each bar with cross sectional dimensions of 1 mm by 1 cm. The spacing of the bars is typically about 1.8 mm, so the overall irradiance distribution from the array consists of bands of light that are separated from each other. Part of the power of the pump light is deposited as heat in the gain medium. Temperature non-uniformity of the gain medium causes wavefront distortion and depolarization of the laser light, which degrades the quality of the solid-state laser beam. It would be advantageous if the individual beams from the bars could be made to overlap or to partially overlap in the gain medium to thereby homogenize the pump beam.

SUMMARY OF THE INVENTION

High-power two-dimensional semiconductor laser arrays are typically used to inject pump light into high average power solid-state lasers. The present invention uses a multifaceted prism having a basic convex-flat cylindrical lens shape to cause the individual beams from a pump semiconductor laser array to overlap or to partially overlap in the gain medium. The beam intensity is more uniform and the dimensions of the overlapped spot are similar to those of the collimated beam from one of the bars. The optical element has a facet corresponding to each laser bar cut into the convex side.

BRIEF DESCRIPTION OF THE DRAWINGS

FIG. 3 is a table of the coordinates of vertices, facet angles, and points where the central light rays cross the optic axis, calculated for a specific diode array.

DESCRIPTION OF THE PREFERRED EMBODIMENT

Figure 1:
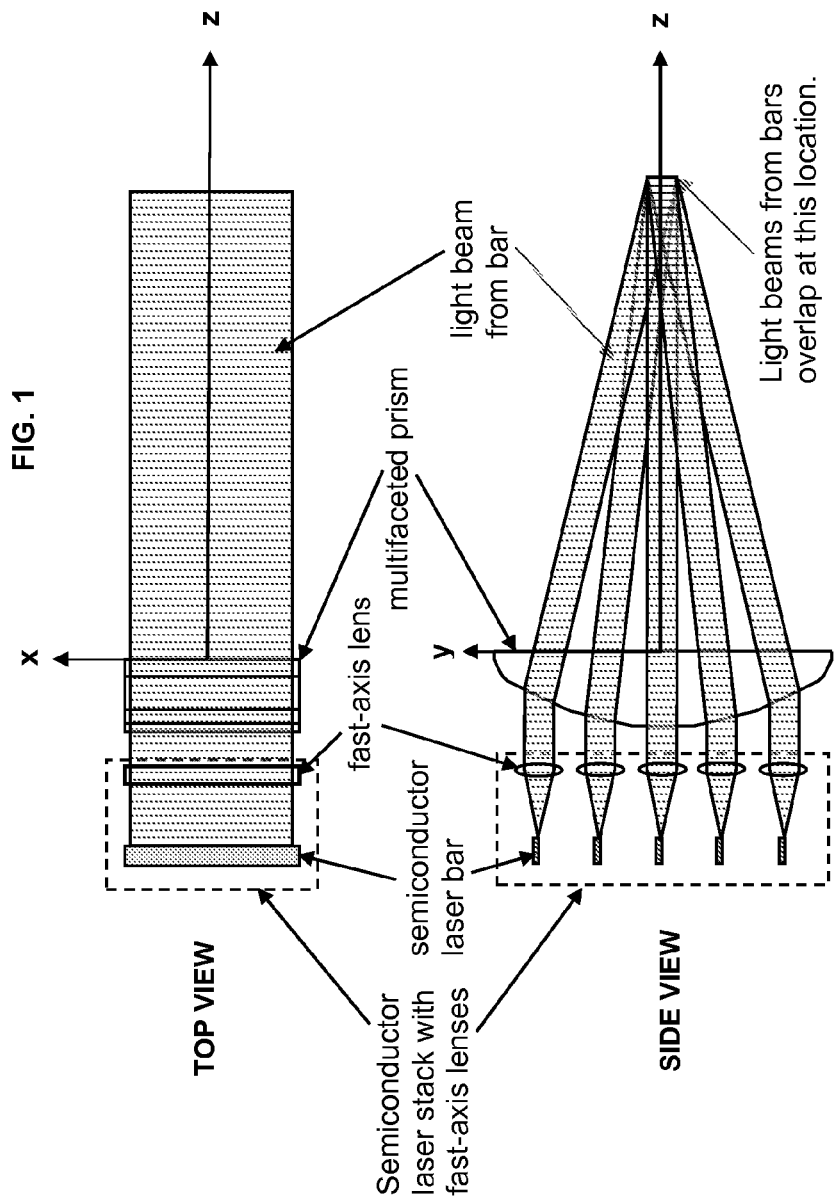
FIG. 1 shows a top view and a side view of a semiconductor laser stack with fast-axis lenses with the individual beams collimated by a multifaceted prism.

High-power two-dimensional semiconductor laser arrays are typically used to inject pump light into high average power solid-state lasers. The arrays are also called stacks because they are stacks of bars. A multifaceted prism can cause the light beams from the individual bars to overlap with each other at a specified distance. FIG. 1 illustrates the concept. It shows top and side view of a semiconductor laser stack with fast-axis lenses. The multifaceted prism directs the light from each laser bar at the desired spot. For an aberration-free prism, the width of the overlapped spot is essentially the same as the width of an individual beam. A simple cylindrical lens could focus the beams, but for typical dimensions, the width of the focus with a dimension of one or more millimeters is of interest here, so additional optics would be required to form a suitable image by magnifying the spot at the focus.

Figure 2:
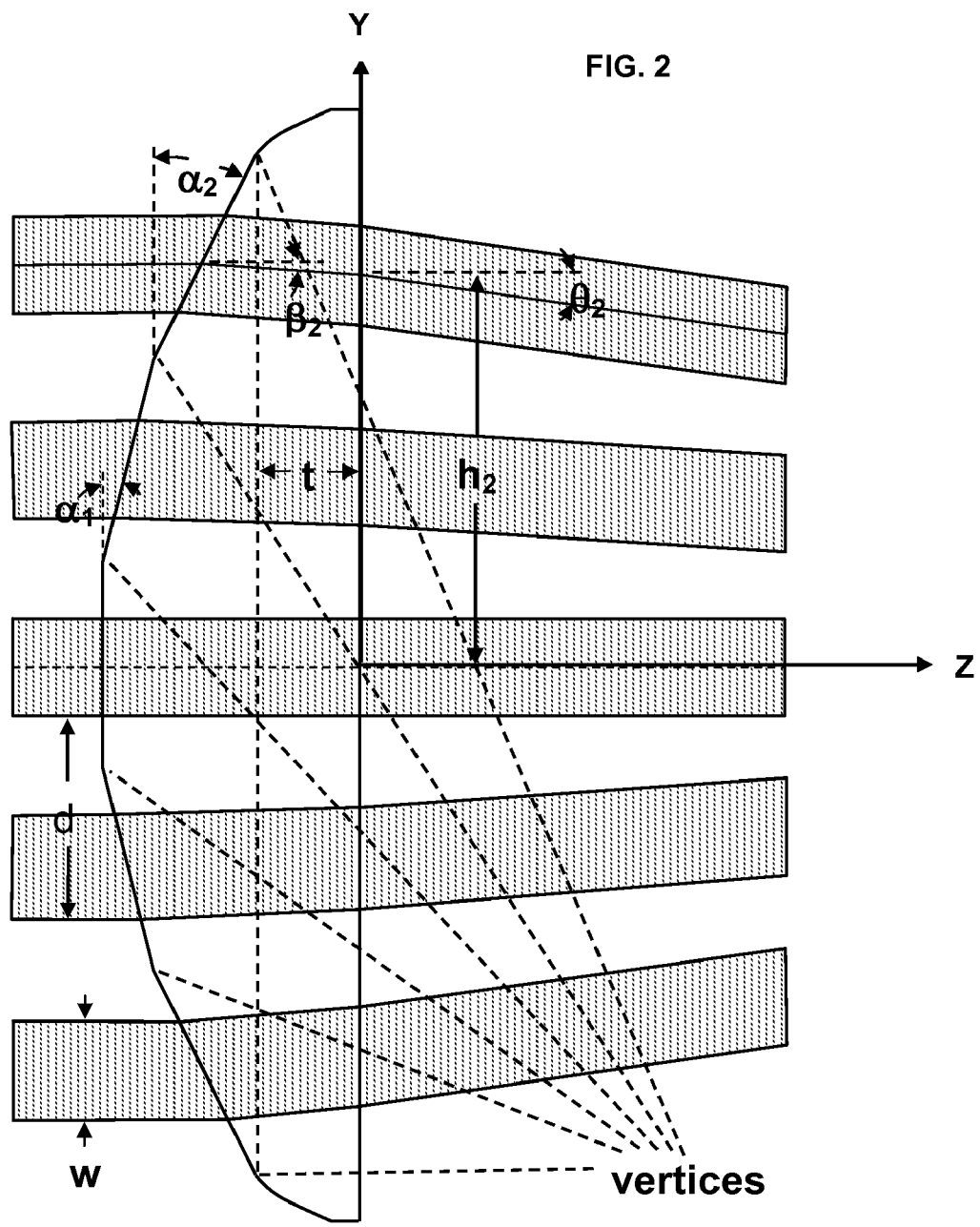
FIG. 2 shows details of the multifaceted prism and the coordinate system used to describe it.

A simple design for the multifaceted prism would have a flat back and a facet on the front corresponding to the output beam from each bar of the semiconductor laser array. For example, FIG. 1 has a 5-bar semiconductor laser array with a 5-faceted prism. The beams from the individual bars overlap to form a cross-section with homogeneous intensity. If the number of bars is odd, the facet in the middle of the prism is parallel to its back. Rays in the y, z plane are considered since the beam from a bar is reasonably well collimated in the x-dimension (as well as in the y-dimension). The coordinate system is shown in FIG. 2. The x-axis is selected such that the y- and z-coordinates of the surfaces of the prism are independent of x. Thus it is sufficient to describe a two-dimensional figure corresponding to the projection of the prism's surface on a plane normal to the x-axis (the n-plane), and to consider the light rays and the optical axis in this plane. Ideally, the central rays of all beams would cross the optical axis at the same location.

If the facets are cut into a blank that has a circular cylindrical front surface so that the vertices of the prism are on a circle in the n-plane, the central rays will be aberrated so that they cross the axis at slightly different locations. The simple design here is based on a blank that has the shape of a convex-flat cylindrical lens. It will be shown that the aberrations are tolerable.

Let $y_i$ be the coordinate of the $i^{th}$ vertex of the prism, counting from the axis up. The coordinate system is shown in FIG. 2 along with the vertices. Since the surface is symmetric about y=0, we will only consider the surface for y>0. The vertices are equally spaced in y, $$y_i = (i - 0.5)d, \qquad (1)$$

where d is the center-to-center spacing of the emitting regions of the bars, i.e. the pitch of the bars. Locations midway between the vertices, $$Y_i = (y_{i+1} + y_i)/2 \qquad (2)$$

and $$Z_i = (z_{i+1} + z_i)/2 \qquad (3)$$

corresponds to the entry "point" into the prism for the central "ray" of the $i^{th}$ beam. The vertices are along a circular cylinder, $$y_i^2 + (z_c - z_i)^2 = r^2, \qquad (4)$$

Where r is chosen to give the desired value for the distance from the output plane of the lens to the plane at which the beams are on top of each other, in the paraxial approximation, $z_0$. Here, $z_c$ is the coordinate of the axis at the center of curvature of the circular cylinder. The angle, $\theta_i$, the central ray makes with the z-axis, after exiting the prism, is given by $$\theta_i = \sin^{-1}\{n \sin[\alpha_i - \sin^{-1}(\sin\alpha_i/n)]\}, \qquad (5)$$

where the facet angles are $\alpha_i$ and n is the refractive index of the prism. The ray angles are illustrated in FIG. 2 for i=2. The angle of the ray inside the prism, with respect to the z-axis is $$\beta_i = \alpha_i - \sin^{-1}(\sin\alpha_i/n) \quad (6)$$

The ray exits the prism at height $$h_i = Y_i - (z_e - Z_i)\tan\beta_i \quad (7)$$

where $z_e$ is the coordinate of the flat surface of the prism. Finally, the distance from the exit plane of the prism to the plane where the central ray exiting the prism crosses the z-axis is $$\zeta_i = h_i/\tan\theta_i. \quad (8)$$

An approximate value can be obtained for r, by applying the lensmaker's formula to the blank, $r_{approx} = \zeta_{desired}(n-1)$.

The following is a specific design example of the multifaceted prism using a Spectra-Physics diode array. The diode array has 25 bars with a pitch of d=1.80 mm. The power of the emitted light is about 1.2 kW at 805 nm. Using Heraeus Infrasil as the type of glass for this example, the refractive index is n=1.45333. It is desirable for the $\zeta_i$ to be about 15 cm, which corresponds to r=70 mm for the radius of curvature of the blank. This corresponds to $z_0$=150.498 mm, which is the distance of the focal point from the exit plane for a cylindrical lens tangent to the center of the first off-axis facet. The thickness of the blank was selected so that the prism had additional thickness, t=2 mm, added to the thickness required to include all the facets (see FIG. 2). The coordinates for the vertices and the values of $\alpha_i$ are listed in the table of FIG. 3. The shape of the faceted surface, z=z(y) is independent of x.

A possible method for fabricating the multifaceted prism is to cut a circular cylindrical surface that runs through the vertices into a blank with a flat back. The facets could then be polished into the cylindrical surface. The central facet could be polished in with the back of the piece parallel to the polishing surface. The piece could then be tilted about a line parallel to the x-axis so that its back would make an angle $\alpha_1$ with the polishing surface, in the y-z plane, and the next facet polished in. It could then be tilted at each successive angle $\alpha_i$ and polished. Then the facets for y<0 could be polished into the surface in a similar manner.

It can be shown that the strip equivalent of third-order spherical aberration represents the aberration of the central rays quite well. Note that a surface tangent to the points $X_i$, $Y_i$ is not a circular cylinder because the vertices are not evenly spaced around the circle corresponding to the surface of the blank. The table in FIG. 3 gives the coordinates where the central rays cross the z-axis. For third-order spherical aberration, the longitudinal aberration is $$\zeta_i - z_f = (\sigma/2)(h_i/z_0)^2 \quad (9)$$

A least-squares fit to the values calculated for $\zeta_i$ resulted in $\sigma$=435.1 mm and $z_f$=150.489 mm. Values for $\zeta_i$, fit($\zeta$)$_i$, obtained using the fit are given in the table. The largest relative error, $$(\text{fit}(\zeta)_i - \zeta_i)/(z_0 - \zeta_i) \quad (10)$$

Is $5\times10^{-3}$. We can use the theory of third-order spherical aberration to obtain the width of the region containing all the central rays at the location of the strip of least confusion, which, corresponds to the circle of least confusion for an axially symmetrical optical system. The half width of the strip of least confusion is $$b = (\sigma/8)(h_m/z_0)^3 \quad (11)$$

and is at the plane z=s where $$s = (z_0 + 3\zeta_m)/4 \quad (12)$$

Here, m is the index of the vertex that is farthest from the center of the prism. For the configuration here, b=0.156 mm is a modest fraction of $\Omega \approx 1.0$ mm, and a design with the vertices along a circle is acceptable.

Multifaceted prisms will be useful in obtaining a reasonably uniform optical intensity distribution for pumping solid-state lasers. The spot width is somewhat larger than the beam width corresponding to an individual bar. Let n be the number of bars and set m=(n−1)/2. The depth $z_r$ over which the width of the intensity distribution of the overlapped beams expands to $1.4\Omega$ is $$z_r = 0.2\Omega n_l z_0/Y_m \quad (13)$$

Where $n_l$ is the index of refraction of the laser crystal in which the pump beam is propagating. For the Spectra-Physics array described above, for $z_0$=150 mm, and for propagation in a YAG medium, the distance over which the pumped spot is less than $1.4\Omega$ is $2z_r$=5 mm. Often the light is injected into a slab and then trapped, in which case the ray angles must not exceed the numerical aperture of the slab. An example of this can be found in C. Stewan et al, "A 1-kW thin disc laser", IEEE J. Selected Topics in Quaint. Electronics, 6 650, 2000.

Pump light from a diode-laser array is sometimes focused onto a gain medium using a combination of lenses that may be spherical or cylindrical. To make a compact laser system it is desirable to focus the spot at a distance no greater than 15 cm from the lens system. This leads to a spot with a width in the y-dimension that is on the order of a few tenths of a millimeter. (The coordinate system is oriented relative to the diode stack as it is in FIG. 2.) It is often desirable for the width of the pumped spot to be greater. Using the multifaceted prism, at the best crossing point the width of the intensity distribution will be about the same as the width of a single beam as it leaves the fast-axis collimating lens, about 1 mm. By moving the pumped spot away from the crossing point, its width can vary up to the sum of the widths of the beams from the individual bars, before stripes appear with dark regions between the pumped regions.

Lens ducts, tapered glass waveguides with curved ends, are sometimes used to homogenize the light from pump arrays and to direct it to the solid-state gain medium. A long duct is usually required to avoid excessive backscattering of the light, which leads to a less compact laser design. The propagation distance for the light in the duct is greater than it would be in a multifaceted prism, so that the absorption loss is greater for the duct. The ratio of the volume to the surface area is greater for the duct, leading to a greater temperature rise.

An aberration-free design can be derived so that the central rays of the light beams from the bars cross the z-axis at the same point. Then equations 1-3 and 5-8 can be used beginning with the same value of $\zeta_i$ for all i. A numerical solution of this transcendental system leads to values for $z_i$ for i=1, ..., m. If the desired distance from the prism to the pumped crystal is substantially less than 15 cm, this may be desirable.

A multifaceted prism may be designed to provide an intensity variation for the pumped spot that varies with y. For example, the distances from the axis of the central rays may vary with i so that the intensity of the pumped spot will be greatest on axis and will decrease as |y| increases to several millimeters.

The invention claimed is:

1. A multi-faceted prism optical element for redirecting and superimposing the collimated laser light beams output from stacks of bars of high-power two-dimensional semiconductor laser arrays that are used to pump high average power solid-state lasers, said bars having a center-to-center spacing of d, said optical element comprising:

a. a cylindrical lens blank having a circular cylindrical front surface and a flat back surface that is the output plane of the lens and with a coordinate system centered on said flat surface with a z-axis perpendicular to said flat surface, an x-axis parallel to the central axis of the cylindrical front surface, and a y-axis making up a right hand system, and b. a plurality of i facets equal to the number of bars and said facets are cut into the circular cylindrical front surface with their coordinates independent of x, such that each facet has its vertices located on said circular surface and said circular surface has a radius r chosen to give the desire value for the distance from the output plane of the lens to a plane at which the beams are approximately superimposed upon each other, said vertices being equally spaced in y given by $y_i=(i-0.5)d$, where d is the center-to-center spacing of the laser light output of the bars and said radius is given by $r^2=y_i^2+(z_c-z_i)^2$ where $(y_i, z_i)$ is the coordinate of the $i^{th}$ vertex and $z_c$ is the coordinate of the axis at the center of curvature of the circular cylindrical surface, such that said multi-faceted prism redirected said collimated laser light beams to thereby superimpose said beams at a desired distance from the multi-faceted prism.

* * * * *